(12) United States Patent
Yang et al.

(10) Patent No.: US 11,682,603 B2
(45) Date of Patent: Jun. 20, 2023

(54) CONTROL OF THERMAL INTERFACE MATERIAL IN MULTI-CHIP PACKAGE

(71) Applicant: Flex Ltd., Singapore (SG)

(72) Inventors: Cheng Yang, Shanghai (CN); Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 2 days.

(21) Appl. No.: 17/212,525

(22) Filed: Mar. 25, 2021

(65) Prior Publication Data

US 2021/0305124 A1    Sep. 30, 2021

(30) Foreign Application Priority Data

Mar. 27, 2020 (CN) .......................... 202010235427.5

(51) Int. Cl.
| | | |
|---|---|---|
| H01L 23/373 | (2006.01) | |
| H01L 23/367 | (2006.01) | |
| H01L 21/66 | (2006.01) | |
| H01L 21/48 | (2006.01) | |
| B23K 1/00 | (2006.01) | |
| H01L 25/065 | (2023.01) | |

(52) U.S. Cl.
CPC .......... *H01L 23/373* (2013.01); *B23K 1/0008* (2013.01); *H01L 21/4882* (2013.01); *H01L 22/12* (2013.01); *H01L 23/367* (2013.01); *H01L 25/0655* (2013.01); *H01L 23/3675* (2013.01); *H01L 23/3737* (2013.01)

(58) Field of Classification Search
CPC ... H01L 23/373; H01L 21/4882; H01L 22/12; H01L 23/367; H01L 25/0655; H01L 23/3675; H01L 24/10; H01L 23/42; H01L 23/10; H01L 23/18; H01L 23/3737; B23K 1/0008; B23K 2101/40; B23K 1/0016
See application file for complete search history.

(56) References Cited

U.S. PATENT DOCUMENTS

| | | | |
|---|---|---|---|
| 2011/0147916 A1* | 6/2011 | Su | H01L 23/433 257/692 |
| 2016/0324031 A1* | 11/2016 | Fujiwara | B32B 9/007 |
| 2018/0374776 A1* | 12/2018 | Liu | H01L 23/3737 |

* cited by examiner

*Primary Examiner* — Patricia D Valenzuela
(74) *Attorney, Agent, or Firm* — Sheridan Ross P.C.

(57) ABSTRACT

An electronic system includes a plurality of heat sources. At least two of the plurality of heat sources vary in height and each of the plurality of heat sources includes a first side and a second side. The electronic system also includes a substrate having a first side and a second side. The second side of each of the plurality of heat sources is positioned adjacent to the first side of the substrate. The electronic system further includes a cover member provided above the plurality of heat sources and a sintering thermal interface material provided between the cover member and the first side of one of the at least two heat sources that vary in height.

20 Claims, 13 Drawing Sheets

CONTROL OF THERMAL INTERFACE MATERIAL IN MULTI-CHIP PACKAGE

CROSS REFERENCE TO RELATED APPLICATION

The present application claims the benefit of and priority to Chinese Patent Application No. 202010235427.5 filed Mar. 27, 2020, the entire disclosure of which is hereby incorporated by reference for all that it teaches and for all purposes.

FIELD

The present disclosure is generally directed to multi-chip packages and methods and in particular to the controlled use of thermal interface material (TIM)s for dissipating heat in the multi-chip packages and methods thereof.

BACKGROUND

Most active electronic components such as integrated circuits, for example, are contained in packages. These packages usually provide the dual function of protecting the electronic components while also serving as a space transformer. A semiconductor package may generally be comprised of various components such as, but not limited to, semiconductor devices (e.g., single or multi-chips/dies), a substrate and interface material (e.g., interconnect media) such as solder for example.

Thermal interface material (TIM) is applied between the electronic component (e.g., chip) and a heat spreader which is provided above the package. Typical heat spreaders include covers, lids, heatsinks, etc. For single chip packages, either a polymer (e.g., glue, grease, etc.) TIM or a solder TIM is typically used. Solder TIMs have a much better thermal resistance than polymers due to their higher thermal conductivity and lower interface resistance as compared to polymers. Specially designed shapes of solder (e.g., circles, squares, rectangles, etc.) called solder preforms are used instead of solder paste for better control of the solder TIM thickness and the elimination of voids when soldering components.

For multi-chip packages, the polymer TIM is more widely used. Polymer TIMs, such as compressible polymer TIMs for example, need to compensate for tolerences in height variations among chips (e.g., chip thickness, flip chip bonding line thickness, heat spreader thickness at different locations, substrate warpage, etc.). Polymer TIMs, however, are poor thermal conductors, which increases the junction temperature rise to the thermally strained chips. Compressible polymer TIMs also need to be pressed for compensating height variations due to manufacturing tolerance mentioned above, which causing bulges on the heat spreader and adds issuse for system level thermal dissipation (second level TIM and heat sink).

When solder preforms are used with multi-die packages, it is difficult to compensate for the height variations in the chips and pressure needs to be applied to the heat spreader during the reflow process when the solder is heated. By applying pressure during the reflow process, excess solder disperses from the covered chips. Such excess solder can be detrimental if dropped down on the component substrate (solder beading). Excess solder around the corner(s) of the chips may cause cracks in the chips. The formation of thin bond line solder between the chips and the heat spreader due to the applied pressure on the chip degrates the relieablity of the solder joint.

Besides being used for single chip packages as stated above, solder TIMs are also used for multi-chip packages when the chips are cut from the same wafer where the variation in height is small. Also, the substrate supporting the chips and the heat spreader covering the chips have to be stable and substantially free from warpage. Because of the numerous challenges identified above, multi-chip packages such as multi-chip module (MCM) central processing unit (CPU)s, chipsets, graphic processing unit (GPU)s, memory devices, etc. still are required to use polymer TIMs. Hence, there is a need for improved TIMs for dissipating heat in the multi-chip packages due to height variations in the chips.

DETAILED DESCRIPTION

Embodiments of the present disclosure will be described in connection with electronic devices, systems and methods and the controlled use of thermal interface material (TIM)s for dissipating heat away from heat sources within the electronic devices and systems. As defined herein heat sources include, but are not limited to semiconductor chip/dies, semiconductor packages including single and multiple chips/dies, microelectronics packages, semiconductor modules and other heat dissipating electronic components. The follow detailed description refers to semiconductor chips/dies within semiconductor packages. But as described above any heat source or combinations of heat sources defined above can be used without departing from the spirit and scope of the present disclosure.

The following detailed description refers to the accompanying drawings. The same reference numbers in different drawings may identify the same or similar elements.

Figure 1:
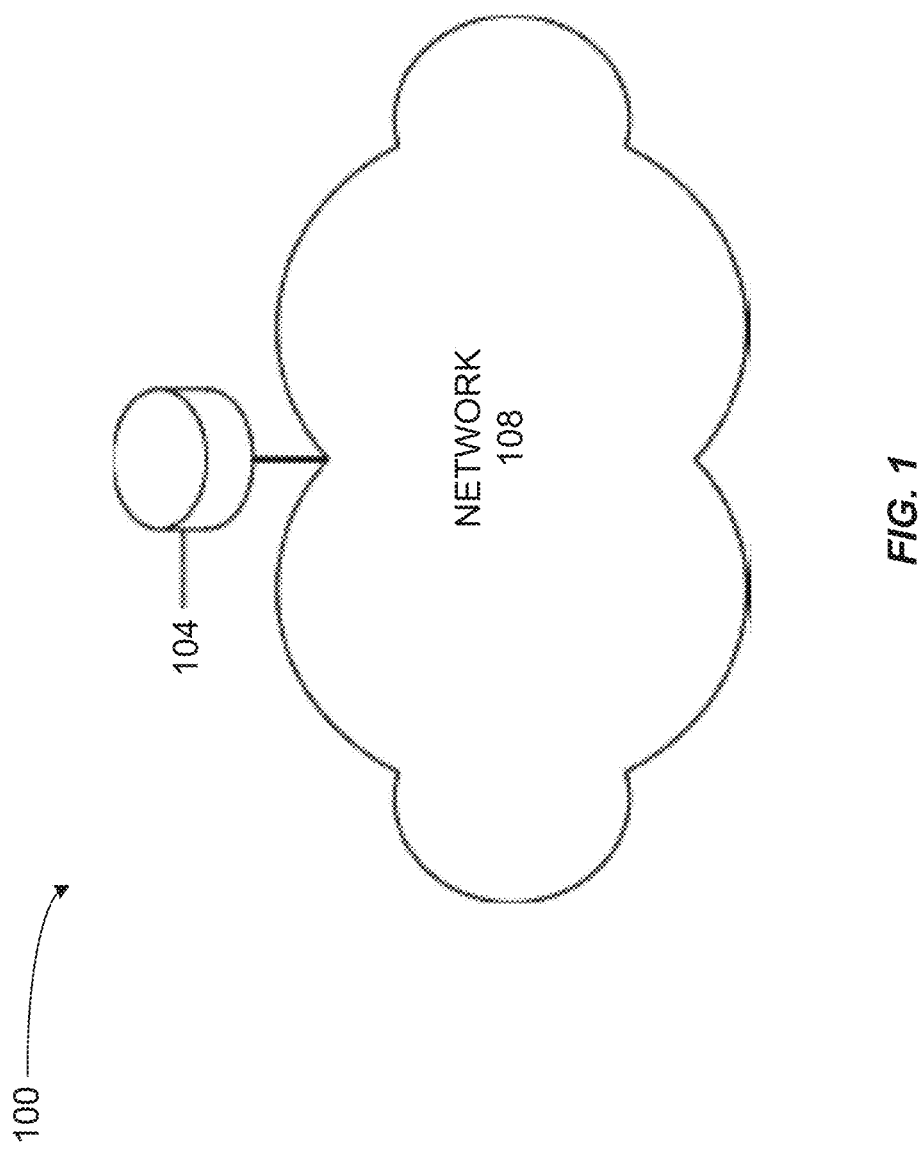
FIG. 1 is a diagram of an example environment in which systems and/or methods described herein may be implemented.

FIG. 1 is a diagram of an example environment 100 in which systems and/or methods described herein may be implemented. Environment 100 may include a device 104 and a network 108. Device 104 may include a networking device for performing network-related functions, such as a router, a server, or a switch. Alternatively, device 104 may include a computing device (e.g., a laptop computer, a desktop computer, a workstation, a notebook computer, a tablet computer, etc.); a communication device (e.g., a smart phone, a personal digital assistant (PDA), a wireless telephone, etc.); etc. that communicates via network 108.

Network 108 may include the Internet, an ad hoc network, a local area network (LAN), a wide area network (WAN), a metropolitan area network (MAN), a cellular network, a public switched telephone network (PSTN), any other network, or a combination of networks. Device 104 may communicate with other devices (not shown) and may communicate through wired and/or wireless communication links via network 108.

Figure 2:
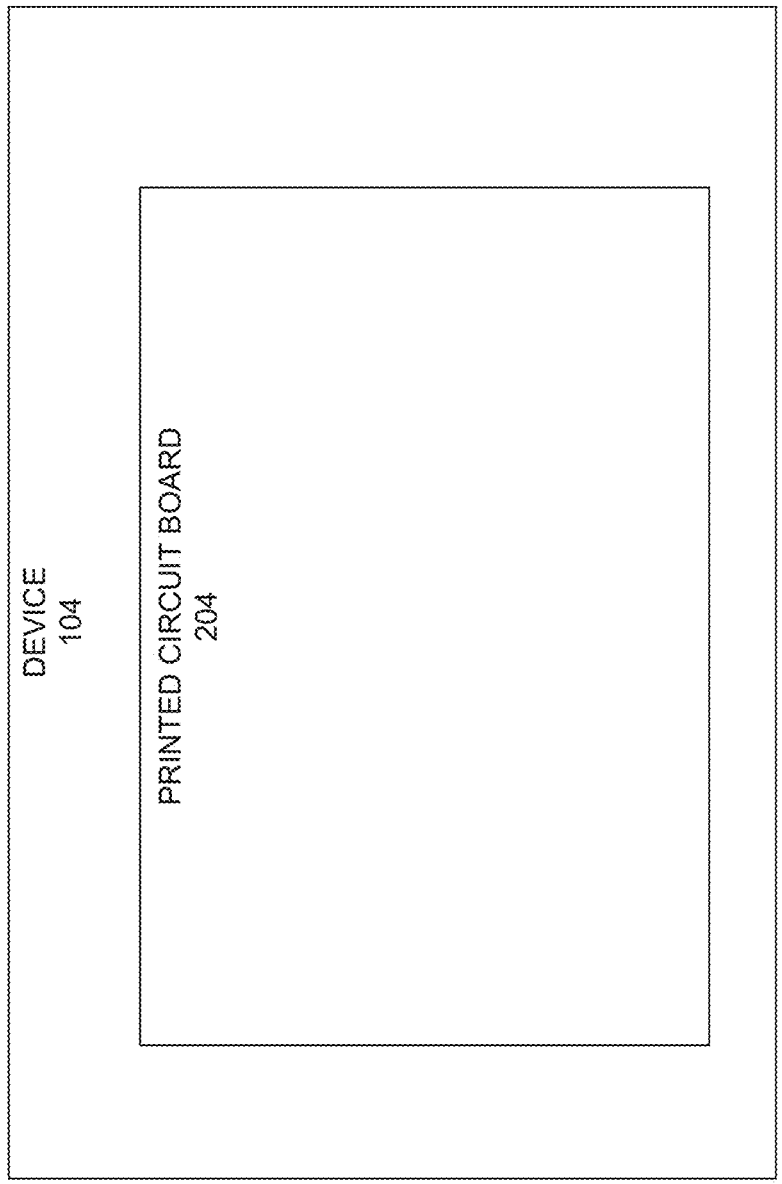
FIG. 2 is a diagram of an example device in FIG. 1.

FIG. 2 is a diagram of example components of device 104. As shown, device 104 may include, for example, a printed circuit board 204 and/or one or more other printed circuit boards (not shown in FIG. 2). Printed circuit board 204 may connect multiple components, such as for example, semiconductor packages via conductive paths through which signals and power may be transmitted. For example, printed circuit board 204 mechanically supports and electrically connects semiconductor packages using conductive tracks, pads and other features etched from one or more sheets layers of copper laminated onto and/or between sheets layers of a non-conductive substrate. The semiconductor package as well as other components are generally soldered onto the printed circuit board 204 to both electrically and mechanically fasten them to it. For example, "through hole" components which typically include large component such as electrolytic capacitors and connectors are mounted by their wire leads passing through printed circuit board 204 and soldered to traces on the other side of the printed circuit board 204. "Surface-mount" components which include transistors, diodes, integrated circuit chips and packages for example, are attached by their leads to copper traces on the same side of the printed circuit board 204. According to embodiments of the present disclosure, printed circuit board 204 is designed to accommodate both methods for mounting components.

Although FIG. 2 shows example components of device 104, in other implementations, device 104 may include fewer components, different components, differently arranged components, or additional components than depicted in FIG. 2. Alternatively, or additionally, one or more components of device 104 may perform one or more other tasks described as being performed by one or more other components of device 104. For example, although FIG. 2 shows what is termed a "printed circuit board," in one example implementation, printed circuit board 204 may be replaced with any electronics-based substrate, such as, for example, rigid-flex circuits, MCMs, micro electro mechanical systems (MEMS), ceramic circuits, midplanes, backplanes, and/or other types of substrates.

Figure 3:
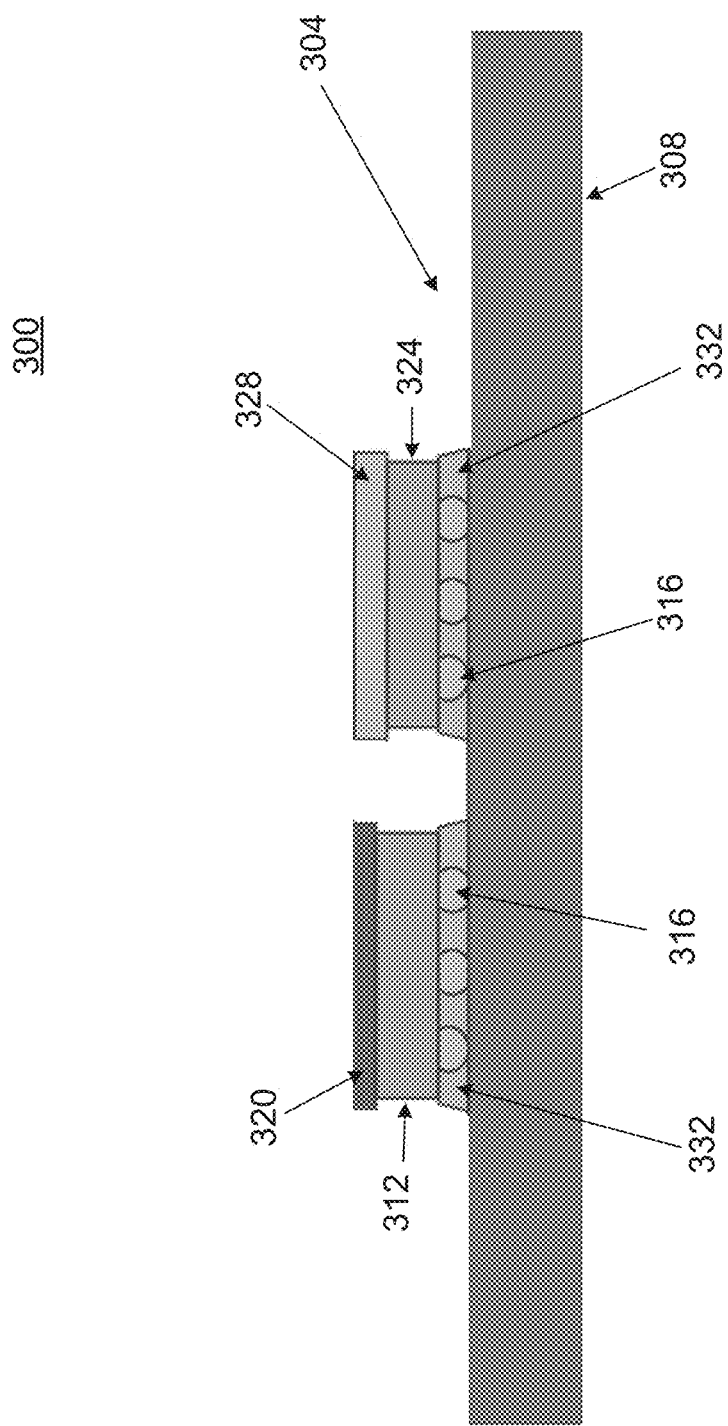
FIG. 3 is a diagram of a cross-sectional view of a conventional uncovered semiconductor package assembly.

FIG. 3 is a diagram of a cross-sectional view of a conventional uncovered semiconductor package assembly 300. The conventional uncovered semiconductor package assembly 300 includes a semiconductor chip/die component region 304 which may include at least two semiconductor devices (chips/dies) 312, 324, a package substrate 308 and internal interconnections 316. The package substrate 308 includes an underfill material 332 on which the at least two semiconductor devices 312, 324 are placed. Bottom surfaces of the at least two semiconductor devices 312, 324 are secured to a top surface of the package substrate 308 via the internal interconnections 316. As illustrated in FIG. 3, the height of semiconductor device 312 is greater than the height of semiconductor device 324. If a cover component is applied across the package substrate 308, this would lead to a gap between the cover component and semiconductor 312 being smaller than a gap between the cover component and semiconductor device 324, given that the cover component is level or flat and has limited imperfections. While nominal height difference can be compensated by different cover component thicknesses above semiconductor devices 312 and 324, manufacturing tolerance induces thickness variations of the gap between the cover component and semiconductor devices 312 and 324. To fill these gaps, a top portion of semiconductor device 312 is supplied with a thermal interface material (TIM) 320 and a top portion of semiconductor device 324 is supplied with a TIM 328 with the thickness of the TIM 328 being greater than the thickness of the TIM 320 to compensate for the height variations in the two semiconductor devices 312, 324. As discussed above, since solder TIMs are used only in the limited situations where chip/dies are cut from the same wafer and the height variations between chips/dies are kept to a minimum, for this multi-chip package illustrated in FIG. 3, TIM 320 and TIM 328 are formed from a compressible polymer (e.g., polymer TIM).

Figure 4:
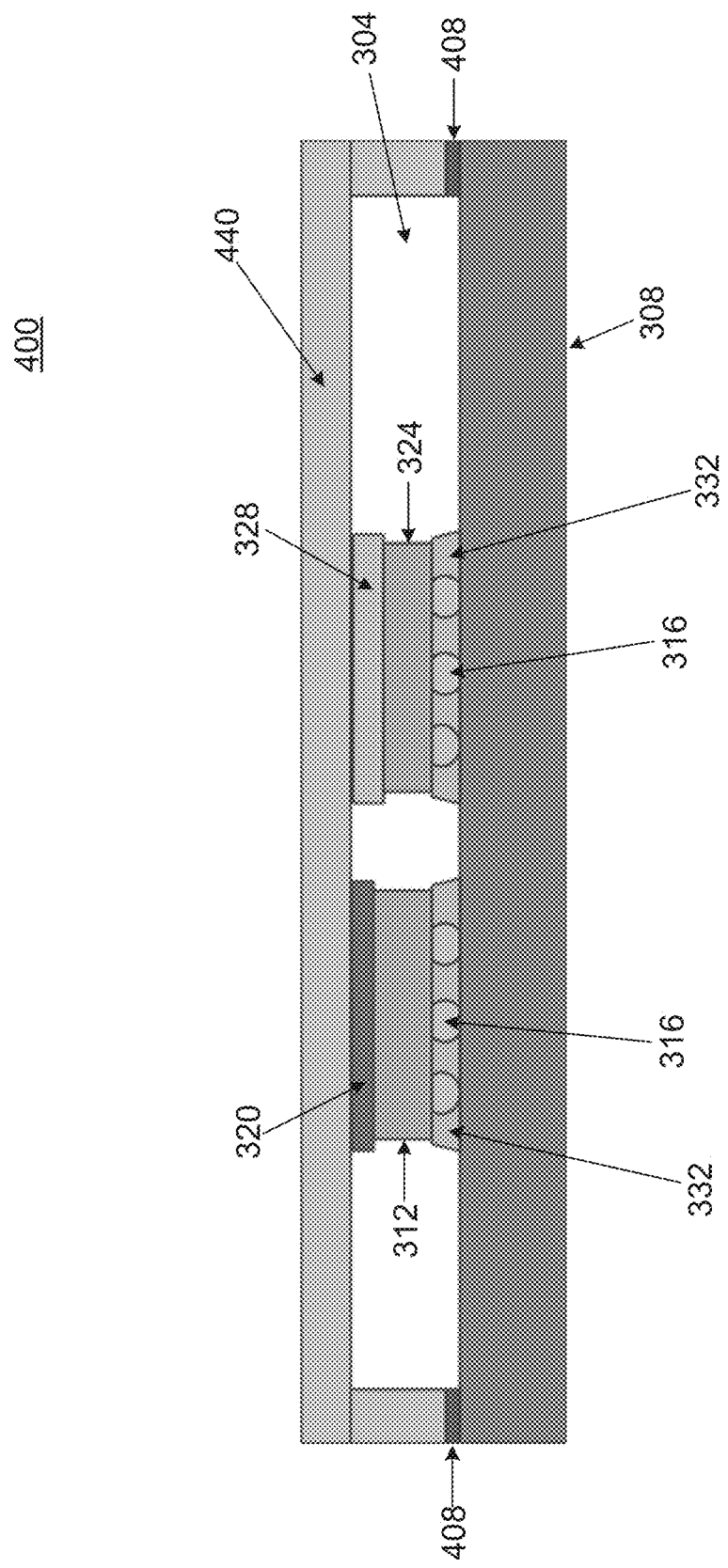
FIG. 4 is a diagram of a cross-sectional view of a conventional semiconductor package assembly with a heat spreader attached thereto.

FIG. 4 is a diagram of a cross-sectional view of a conventional semiconductor package assembly 400 with a heat spreader attached thereto. As illustrated in FIG. 4 where the same reference numbers apply to the same elements, heat spreader 440 is in the form of a lid that is provided above the package substrate 308. As illustrated, heat spreader 440 takes the form of a single contiguous piece of material that spans the dimensions of the package substrate 308. Heat spreader 440 is secured to the package substrate 308 by adhesives 408. As discussed above, polymer TIMs 320, 328 suffer from the negative effects of poor thermal conductivity. In addition, compressible polymer TIMs need pressure to compensate for the height variations due to manufacturing tolerance, which could cause bulges of the heat spreader.

Figure 5:
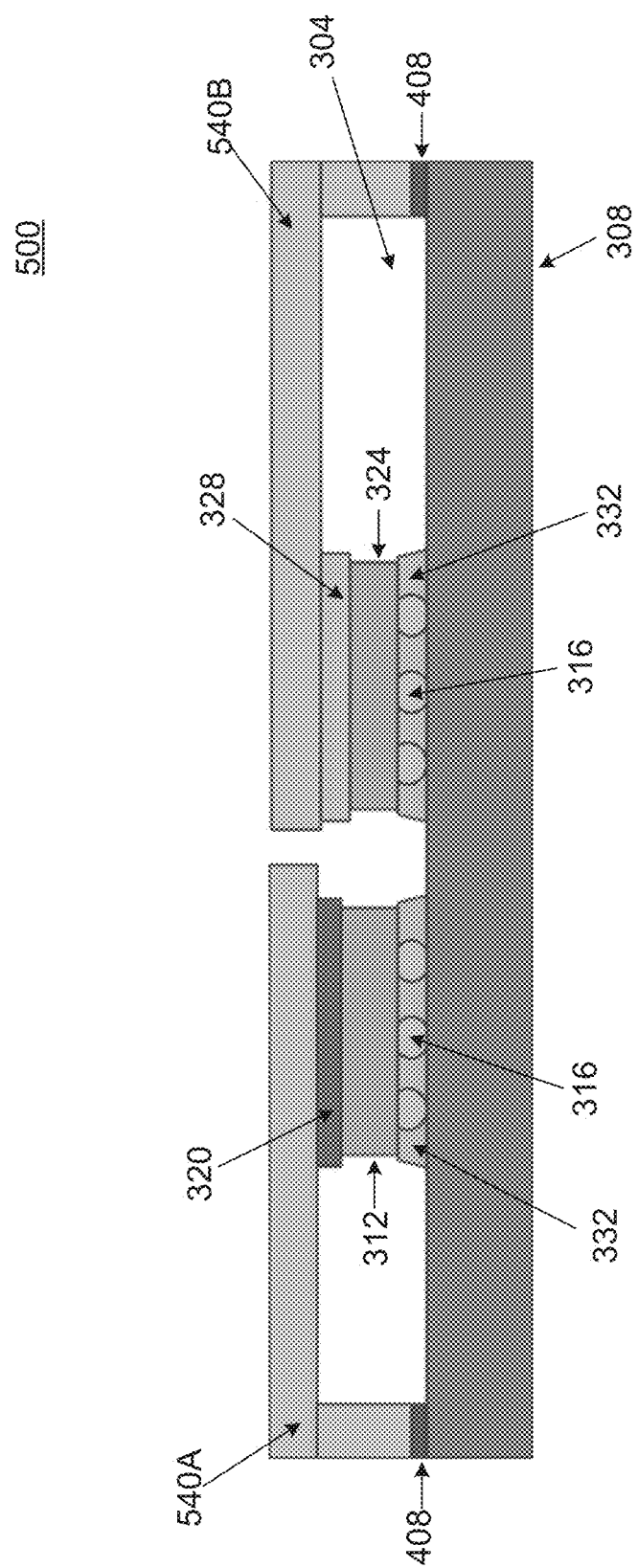
FIG. 5 is a diagram of a cross-sectional view of another conventional semiconductor package assembly with a split heat spreader attached thereto.

One way to combat these problems is to incorporate a split head spreader design. FIG. 5 is a diagram of a cross-sectional view of another conventional semiconductor package assembly 500 incorporating a split heat spreader. As illustrated in FIG. 5 where the same reference numbers apply to the same elements, split heat spreader 540A, 540B is positioned over semiconductor devices 312 and 324, respectively. Polymer or solder TIM 320 is provided between split heat spreader 540A and semiconductor device 312 and polymer or solder TIM 328 is provided between split heat spreader 540B and semiconductor device 324.

Split heat spreader 540A, 540B is secured to the package substrate 308 with adhesives 408.

From a thermal conductivity point of view, the split heat spreader 540A, 540B isolate the semiconductor devices 312 and 324 from each other. Although TIMs 320 and 328 can be optimized individually, the height variation due to manufacturing tolerance in the two semiconductor devices 312 324 is still a problem because split heat spreader 540A and 540B are not flat.

Split heat spreader designs are not optimized for thermal performance. Even with this complicated mechanical design, which yields higher costs, the split heat spreader is more like an isolated individual heat spreader for each chip/die. Hence under different scenarios (e.g., different power dissipation from different chip/dies), thermal performance is not balanced. For example, a CPU and a GPU might not be fully powered at the same time due to the total power limit of the MCM, hence the integrated (one piece) heat spreader can provide larger spreading area for either the CPU or the GPU at different thermal dissipation scenarios. But for the split heat spreader design, larger heat spreaders would be required for both the CPU and the GPU, which is limited by semiconductor package size and available space.

Figure 6:
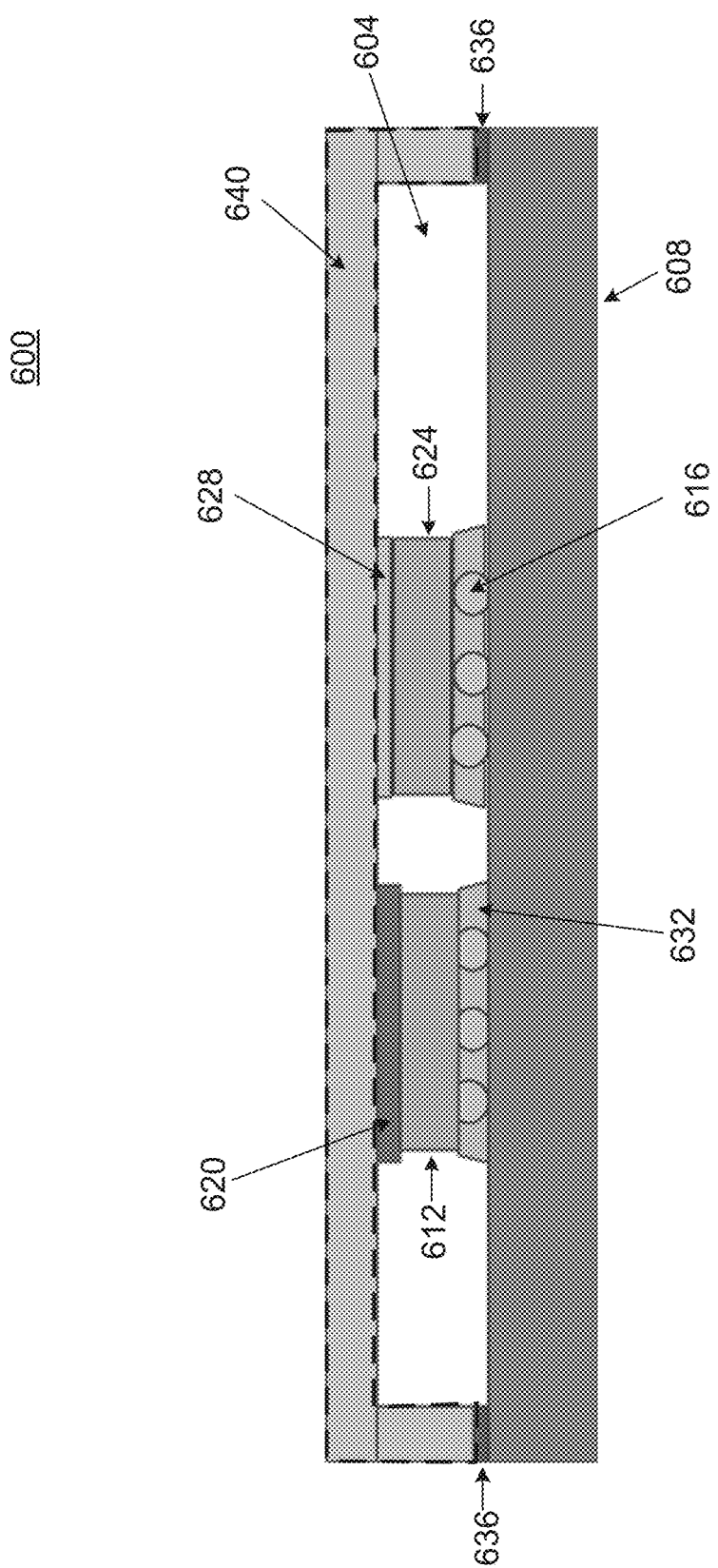
FIG. 6 is a diagram of a cross-sectional view of an example semiconductor package assembly in a measurement stage in accordance with one or more embodiments of the present disclosure.

FIG. 6 is a diagram of a cross-sectional view of an example semiconductor package assembly 600 in accordance with one or more embodiments of the present disclosure. FIG. 6 illustrates a side view of the semiconductor package assembly 600. As shown, the semiconductor package assembly 600 includes a semiconductor chip/die component region 604 which may include at least two semiconductor devices 612, 624, a package substrate 608 and internal interconnections 616. The semiconductor package assembly 600 further includes an underfill material 632 on which the at least two semiconductor devices 612, 624 are placed. Bottom surfaces of the at least two semiconductor devices 612, 624 are secured to a top surface of the package substrate 608 via the internal interconnections 616. As illustrated in FIG. 6, the height of semiconductor device 612 is slightly smaller than the height of semiconductor device 624. In practice, semiconductor chip/die component region 604 may include more components, fewer components, different components, and/or differently arranged components than are shown in FIG. 6. Package substrate 608 is typically formed of a resin multiple layer laminate such as a Bismaleimide-Triazine (BT) resin multiple layer laminate. According to an alternative embodiment of the present disclosure, package substrate 608 may include a ceramic material, a fiberglass material, and/or one or more other types of materials (e.g., epoxy). In some implementations, package substrate 608 may include an organic core BGA substrate, which may be fiberglass-based. In one example, a coefficient of thermal expansion (CIE) (e.g., in parts per million (ppm)/° C.) of package substrate 608 may match a CTE of printed circuit board 204 on an x-y plane. In another example, the CTE of package substrate 608 may match the CTE of printed circuit board 204 when a value of the CTE of package substrate 608 is approximately equal to a value of the CTE of printed circuit board 204. The CTE of package substrate 608 is usually between the CTE of PCB 204 and the CTE of semiconductor devices 612 or 624.

The underfill material 632 is added or dispensed subsequent to the semiconductor devices 612 and 624 being mounted and is provided for stress distribution in the semiconductor chip/die component region 604. Bottom surfaces of the at least two semiconductor devices 612 and 624 are secured to a top surface of the package substrate 608 via the internal interconnections 616. Internal interconnections 616 may include an array of balls (e.g., solder balls), pins, and/or one or more other types of interconnections that connect the at least two semiconductor devices 612 and 624 to the package substrate 608 for example. A bottom portion of the package substrate 608 includes external interconnections (not shown) which may include an array of balls (e.g., solder balls), pins, and/or one or more other types of interconnections that connect the semiconductor chip/die component region 604 to the printed circuit board 204.

According to an embodiment of the present disclosure, since the heights of semiconductor devices 612 and 624 are approximately the same, gaps formed between the semiconductor devices and a tooling component 640 applied across the package substrate 608, would have approximately the same height. Tooling component 640 is detachably coupled to the package substrate 608 such that end portions of tooling component temporarily, but not permanently, adhere to adhesive 636. In another embodiment, the tooling component 640 can be coupled to package substrate by a placement machine, without adhesive 636. Accordingly, a top portion of one of the at least two or more semiconductor devices 612, 624 is provided with a solder TIM 620, in the form of a solder preform for example, and a top center portion of the other of the at least two semiconductor devise 612, 624 is provided with a sintering TIM 628. According to one embodiment of the present disclosure, sintering TIM 628 may by be a sintering paste such as a metal sintering paste. The metal sintering paste may include a nanoparticle Ag or Cu sintering paste or other type of metal sintering paste. Cu sintering paste is also commonly available. The selection of the one of the two or more semiconductor devices that receives the solder TIM 620 and the selection of the one of the two or more semiconductor devices receives that sintering TIM 628 could be arbitrary or could be selected based on thermal and other considerations. For example, solder TIM 620 could be applied to the larger of the at least two semiconductor devices 612, 628 since smaller semiconductor devices have a higher reliability risk at a die's center due to tensile stress as compared with larger semiconductor devices.

As illustrated in FIG. 6, sintering TIM 628 is dispensed on the center of semiconductor device 624 with the height of the sintering TIM 628 equal to or slightly larger than a maximum gap (with tolerance considered) between the die surface and heat spreader inner surface (referred as "TIM gap" below). Specially designed tooling 640 is used to simulate the heat spreader attachment, which squeezes (TIM) paste for those (semiconductor devices) with smaller TIM gaps. Subsequent height and volume measurement disclose the actual TIM gap and hence area coverage. Additional sintering paste dispense is used to compensate uncovered areas (initial volume dispensed is equal to or slightly less than minimum volume of the TIM gap with tolerance considered). MIN and MAX gaps refer to the smallest and largest gap due to manufacturing tolerance.

Tooling component 640 as illustrated in FIG. 6 is in the form of a cover or lid. According to embodiments of the present disclosure, tooling component 640 can take the form of various configurations, including but not limited to metal, ceramic or plastics. After tooling component 640 temporarily adheres to the package substrate 608 and squeezes out sintering TIM 628, height and volume measurements are taken for the sintering TIM 628 using various methods such as, but not limited to 3D solder paste inspection (SPI). As illustrated in FIG. 6, the TIM gap is at a minimum tolerance. Therefore, sintering TIM 628 which was dispensed on the center of semiconductor device 624 is dispersed by the tooling component 640 to cover an entire area of the top of semiconductor device 624.

Figure 7:
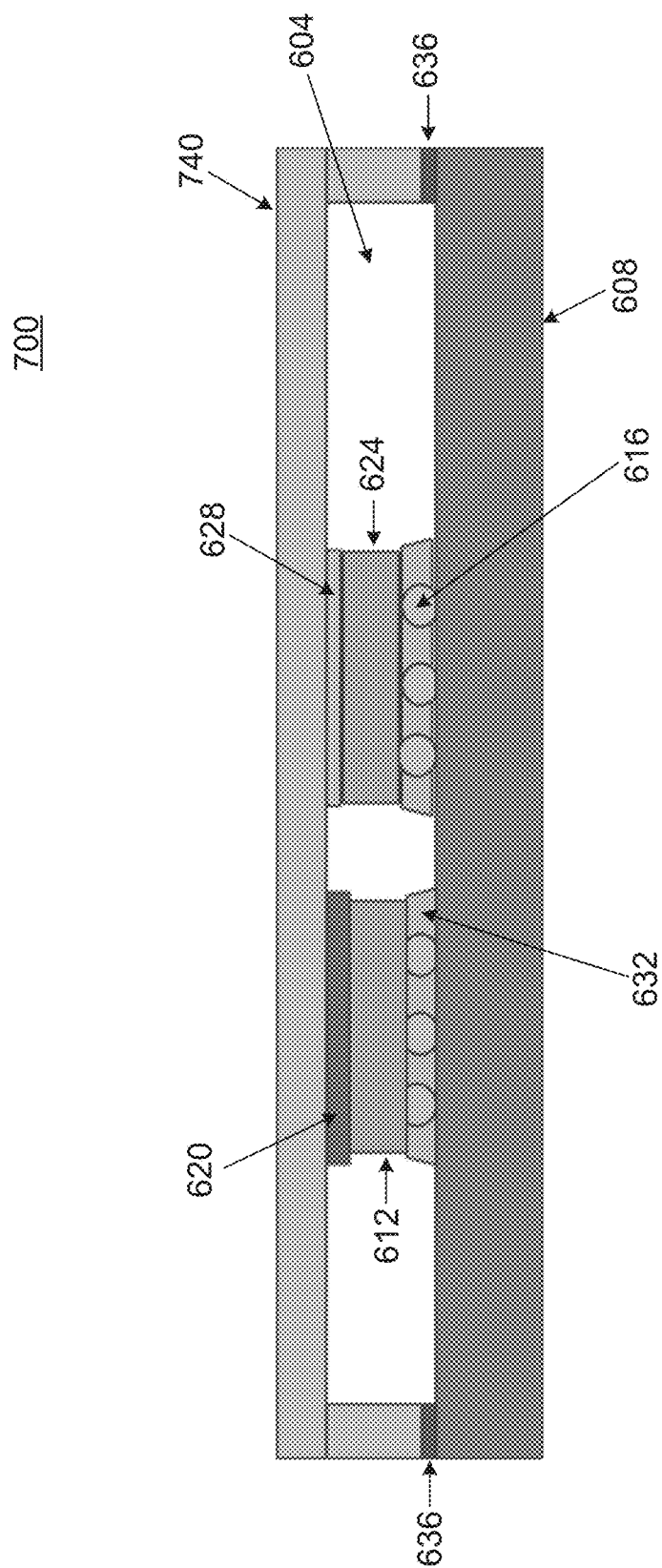
FIG. 7 is a diagram of a cross-sectional view of an example semiconductor package assembly incorporating a heat spreader in accordance with one or more embodiments of the present disclosure.

FIG. 7 is a diagram of a cross-sectional view of an example semiconductor package assembly 700 incorporating a heat spreader in accordance with one or more embodiments of the present disclosure. As illustrated in FIG. 7 where the same reference numbers apply to the same elements, heat spreader 740 is in the form of a lid that is provided above the package substrate 608 and replaced with tooling component 640 after the height and volume measurement have been taken.

Figure 8:
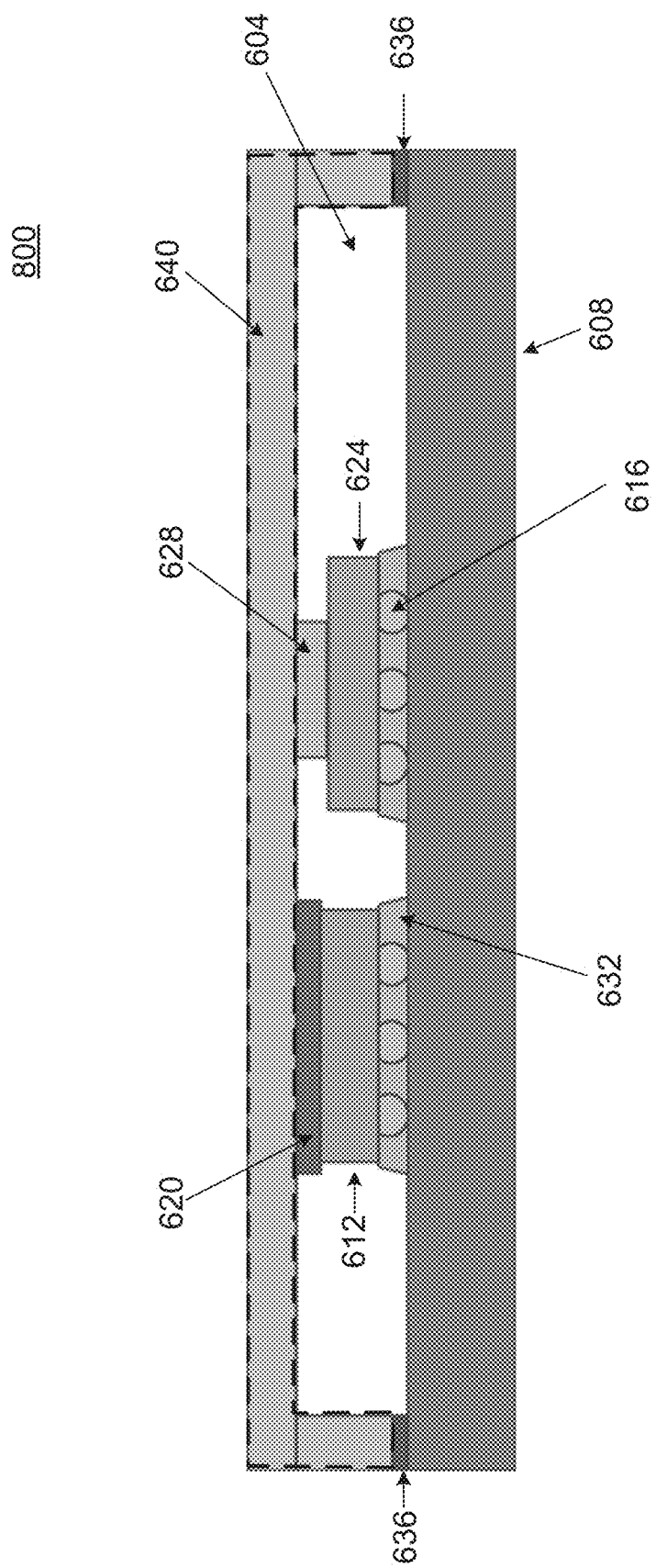
FIG. 8 is a diagram of a cross-sectional view of another example semiconductor package assembly in a measurement stage in accordance with one or more embodiments of the present disclosure.

FIG. 8 is a diagram of a cross-sectional view of another example semiconductor package assembly 800 in a measurement stage in accordance with one or more embodiments of the present disclosure. As illustrated in FIG. 8 where the same reference numbers apply to the same elements, the tooling component 640 is provided across the package substrate 608. After tooling component 640 temporarily adheres to the package substrate 608 and squeezes out sintering TIM 628, height and volume measurements are taken for the sintering TIM 628 using various methods such as, but not limited to 3D SPI. FIG. 8 illustrates a TIM gap at a maximum tolerance, where the sintering TIM 628 is dispensed on the top center of semiconductor device 624 and only partially covers the top surface area of the semiconductor device 624. Additional sintering TIM 628 is dispensed to compensate for the TIM maximum gap tolerance so that the additional sintering material covers the entire top surface area of the semiconductor device 624.

Figure 9:
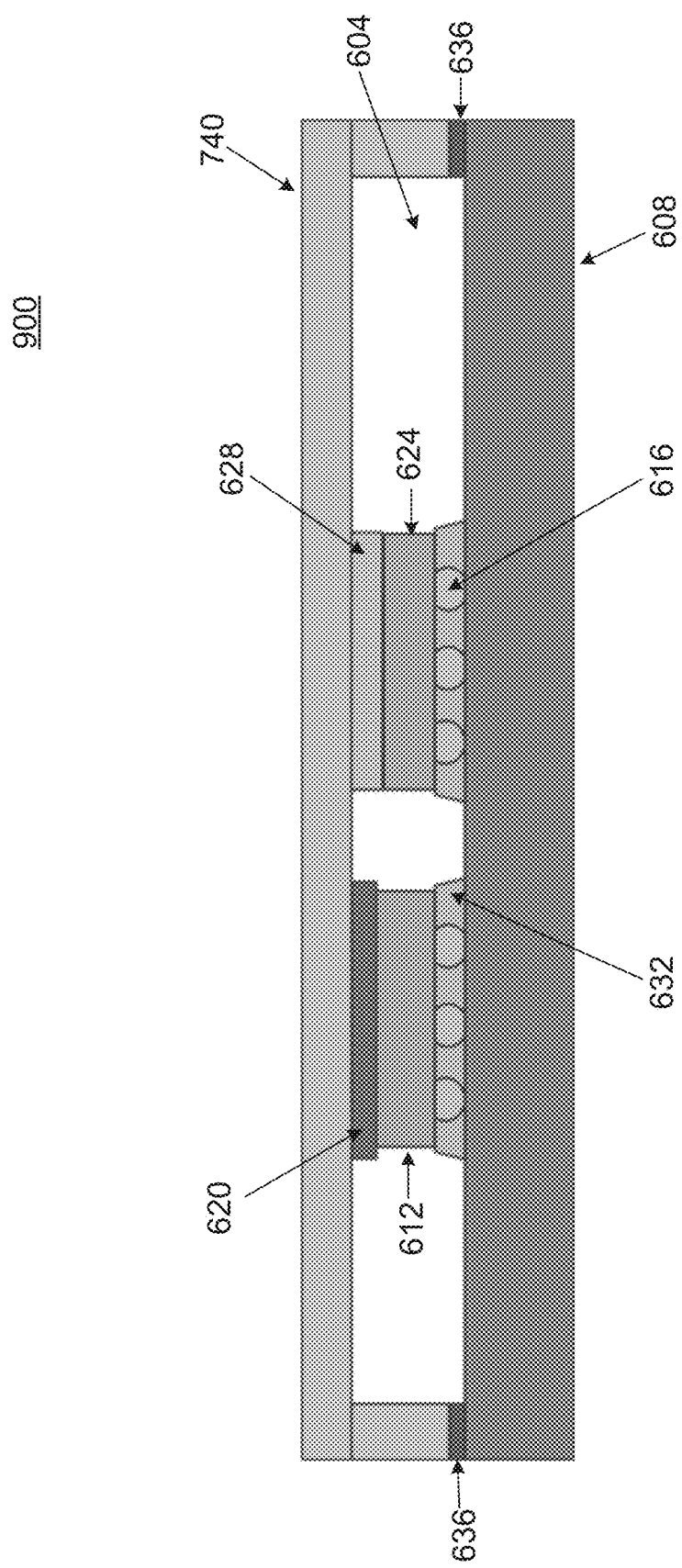
FIG. 9 is a diagram of a cross-sectional view of another example semiconductor package assembly incorporating a heat spreader in accordance with one or more embodiments of the present disclosure.

FIG. 9 is a diagram of a cross-sectional view of another example semiconductor package assembly 900 incorporating a heat spreader in accordance with one or more embodiments of the present disclosure. As illustrated in FIG. 9 where the same reference numbers apply to the same elements, heat spreader 740 is in the form of a lid that is provided above the package substrate 608. FIG. 9 corresponds to FIG. 8 (measurement stage) and FIG. 7 corresponds to FIG. 6 (measurement stage).

Figure 10:
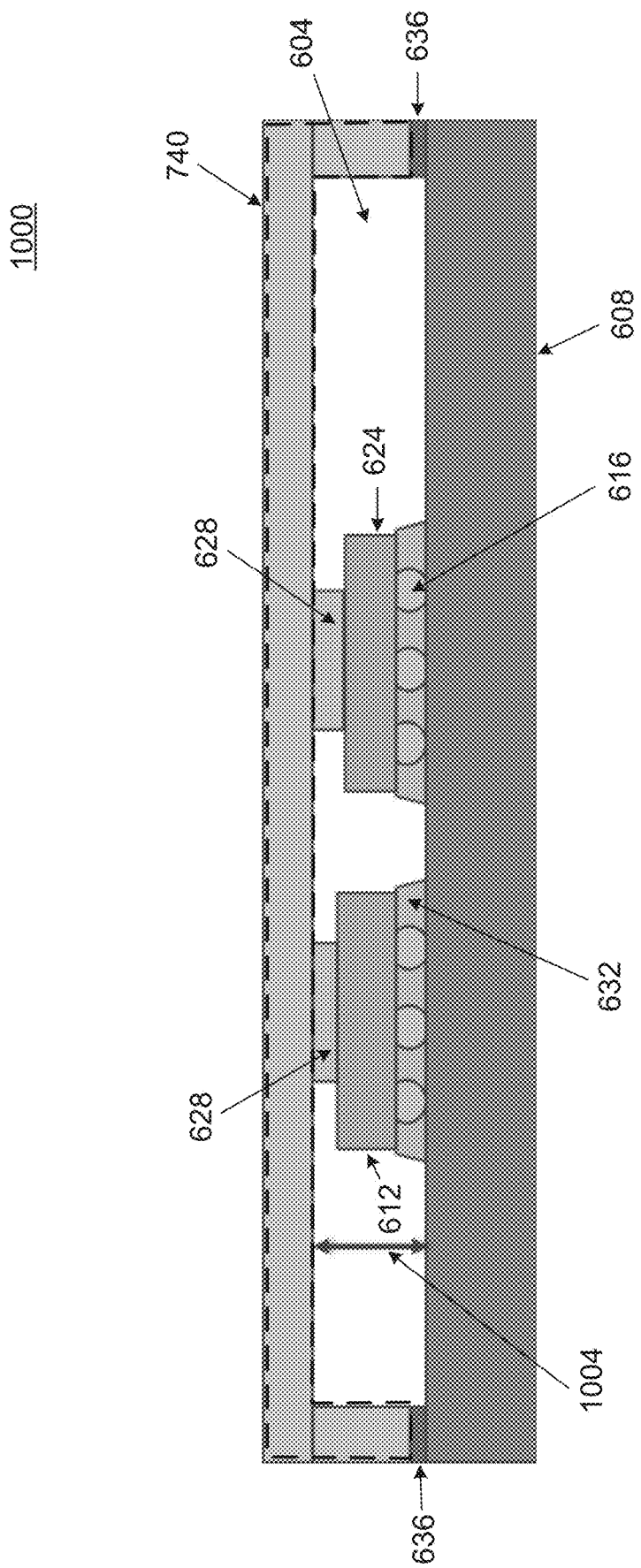
FIG. 10 is a diagram of a cross-sectional view of an alternative example semiconductor package assembly in a measurement stage in accordance with one or more embodiments of the present disclosure.

FIG. 10 is a diagram of a cross-sectional view of an alternative example semiconductor package assembly 1000 in a measurement stage in accordance with one or more embodiments of the present disclosure. According to an alternative embodiment of the present disclosure, sintering TIM 628 can be used for each of the at least two semiconductor devices since sinter material has a better reliability (e.g., temperature cycling) in cases where solder TIM cannot meet reliability requirements. As illustrated in FIG. 10 where the same reference numbers apply to the same elements, the tooling component 640 is provided across the package substrate 608. After tooling component 640 temporarily adheres to the package substrate 608 and squeezes out sintering TIMs 628, height and volume measurements are taken for the sintering TIMs 628 using various method such as, but not limited to 3D SPI. Additional sintering TIM 628 is dispensed to compensate for the actual TIM gap shown as 1004 so that the additional sintering material covers the entire top surface area of the semiconductor device 624 and 612.

Figure 11:
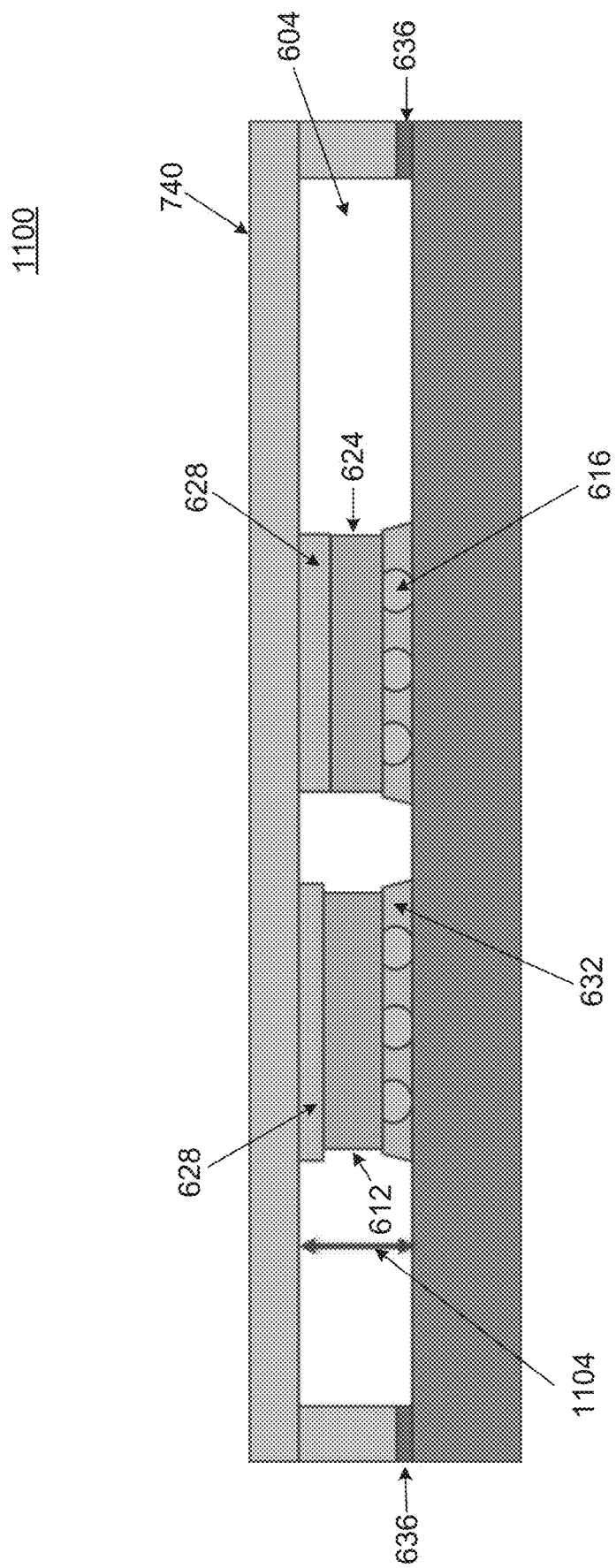
FIG. 11 is a diagram of a cross-sectional view of the alternative example semiconductor package assembly incorporating a heat spreader in accordance with one or more embodiments of the present disclosure.

FIG. 11 is a diagram of a cross-sectional view of the alternative example semiconductor package assembly 1100 incorporating a heat spreader in accordance with one or more embodiments of the present disclosure. As illustrated in FIG. 11 where the same reference numbers apply to the same elements, heat spreader 740 is in the form of a lid that is provided above the package substrate 608. The actual TIM gap is shown as 1104. FIG. 11 corresponds to FIG. 10 (measurement stage).

Figure 12:
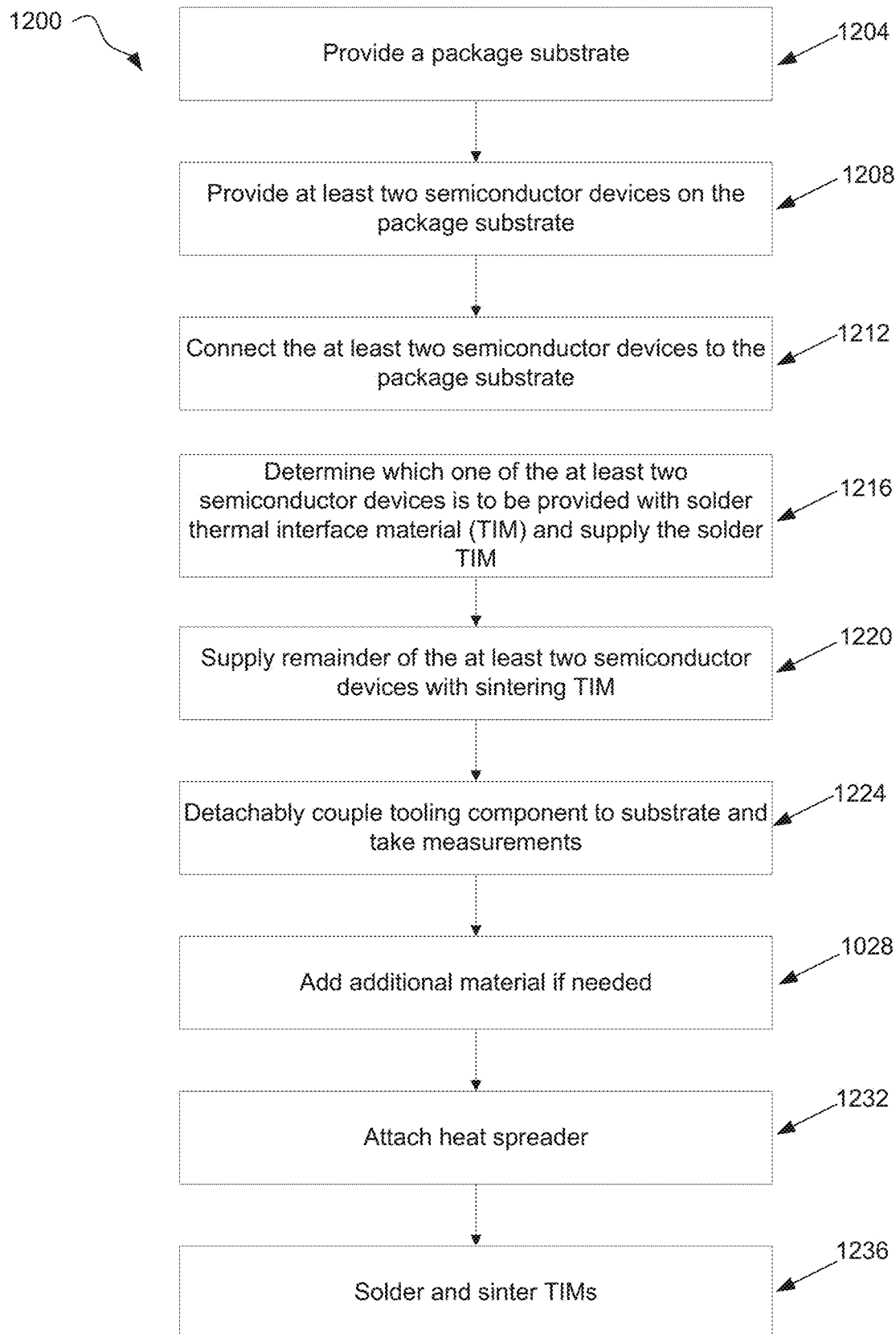
FIG. 12 is a flowchart of an example process for creating a semiconductor package assembly in accordance with one or more embodiments of the present disclosure.

FIG. 12 is a flowchart of an example process for creating a semiconductor package assembly in accordance with one or more embodiments of the present disclosure. As shown in FIG. 12, process 1200 may include providing a package substrate (block 1204) and providing at least two semiconductor devices on the package substrate (block 1208). Process 1200 may further include connecting the at least two semiconductor devices to the package substrate (block 1212). Process 1200 may also include determining which one of the at least two semiconductor devices receives the soldering TIM and which of the remaining at least two semiconductor devices receives sintering TIM (block 1216). According to one exemplary embodiment of the present disclosure, the determination is made by size. Once the solder TIM has been applied to the one of the two or more semiconductor devices, sintering TIM is applied to the remainder of the two or more semiconductor devices (block 1220). Process 1200 may include detachably coupling a tooling component to the package substrate and obtain height and volume measurements (block 1224) and adding additional sintering material if needed (block 1228). Additional sintering material is typically added if a uniform bond line with full coverage is not present after the first application. Process 1200 further includes attaching a heat spreader (block 1232) and then soldering and sintering the TIMs to form a semiconductor package assembly (block 1236).

Figure 13:
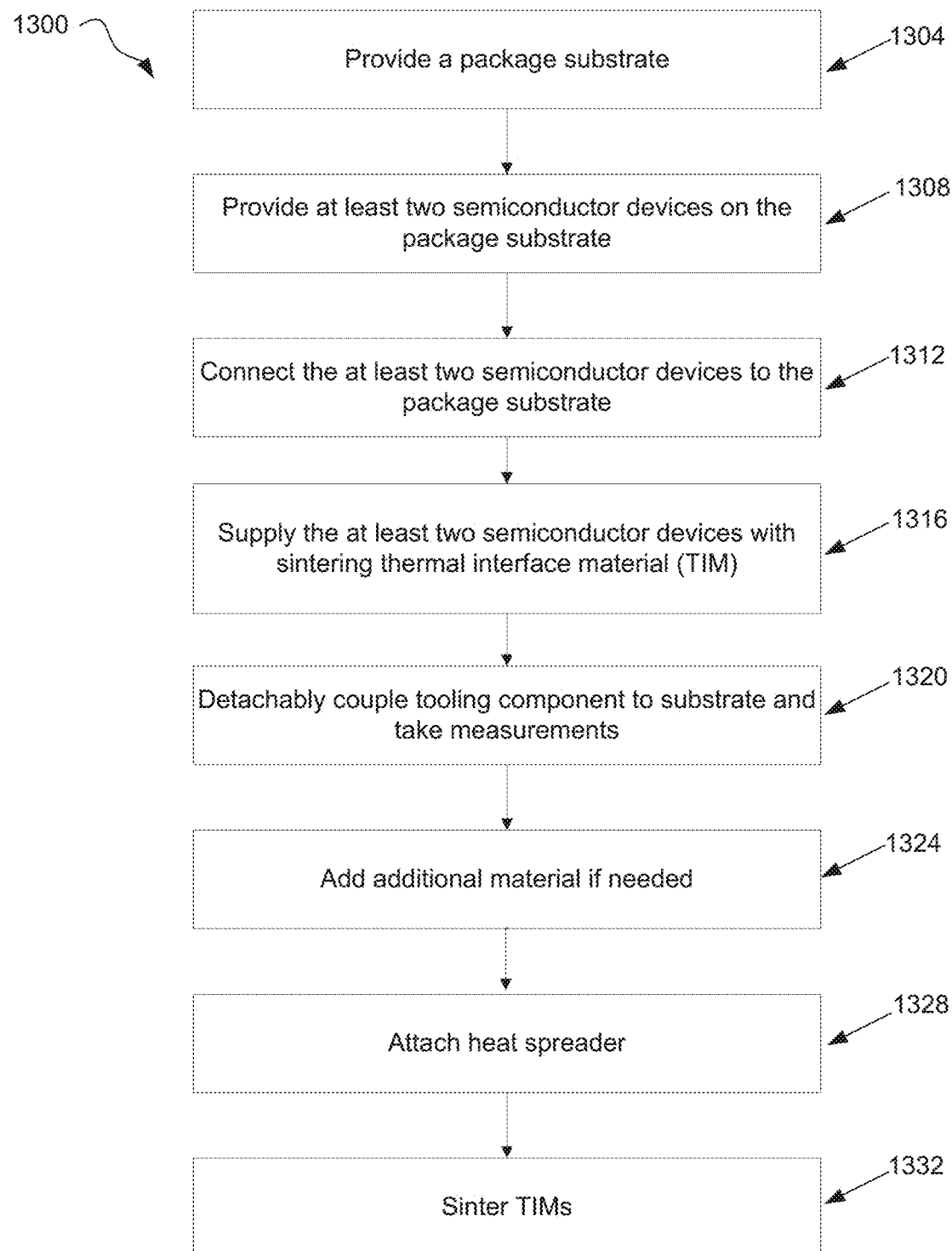
FIG. 13 is a flowchart of an alternative example process for creating a semiconductor package assembly in accordance with one or more embodiments of the present disclosure.

FIG. 13 is a flowchart of an alternative example process for creating a semiconductor package assembly in accordance with one or more embodiments of the present disclosure. As shown in FIG. 13, process 1300 may include providing a package substrate (block 1304) and providing at least two semiconductor devices on the package substrate (block 1308). Process 1300 may further include connecting the at least two semiconductor devices to the package substrate (block 1312). Process 1300 also includes applying sintering TIM to the two or more semiconductor devices (block 1316). Process 1300 may include detachably coupling a tooling component to the package substrate and obtain height and volume measurements (block 1320). Process 1300 may include adding additional sintering material if need (block 1324). Process 1300 further includes attaching a heat spreader (block 1328) and then sintering the TIMs to form a semiconductor package assembly (block 1332).

Any of the steps, functions, and operations discussed herein can be performed continuously and automatically.

The exemplary systems and methods of this disclosure have been described in relation thermal interface material structures. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications. While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system. Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

What is claimed is:

1. An electronic system, comprising:
a plurality of heat sources,
wherein at least two of the plurality of heat sources vary in height, and
wherein each of the plurality of heat sources includes a first side and a second side;
a substrate having a first side and a second side,
wherein the second side of each of the plurality of heat sources is positioned adjacent to the first side of the substrate;
a cover member provided above the plurality of heat sources;
a sintering thermal interface material provided between the cover member and the first side of one of the at least two heat sources that vary in height; and
a solder thermal interface material provided between the cover member and the first side of another of the at least two heat sources that vary in height.

2. The electronic system of claim 1, further comprising the sintering thermal interface material being provided on a center portion without extending to edge portions of the first side of the one of the at least two heat sources that vary in height.

3. The electronic system of claim 1, further comprising the solder thermal interface material extending beyond edge portions of the first side of the another of the at least two heat sources that vary in height.

4. The electronic system of claim 1, wherein the sintering thermal interface material includes a sintering paste such as a metal sintering paste.

5. The electronic system of claim 4, wherein the metal sintering paste includes at least one of a nanoparticle Ag or Cu sintering paste.

6. The electronic system of claim 1, wherein the solder thermal interface material includes solder preforms.

7. The electronic system of claim 1, wherein the cover member is a heat spreader.

8. A semiconductor package, comprising:
a plurality of semiconductor devices,
wherein at least two of the plurality of semiconductor devices vary in height, and
wherein each of the plurality of semiconductor devices includes a first side and a second side;
a substrate having a first side and a second side,
wherein the second side of each of the plurality of semiconductor devices is positioned adjacent to the first side of the substrate;
a cover member provided above the plurality of semiconductor devices;
a sintering thermal interface material provided between the cover member and the first side of one of the at least two of the plurality of semiconductor devices that vary in height; and
a solder thermal interface material provided between the cover member and the first side of another of the at least two semiconductor devices that vary in height.

9. The semiconductor package of claim 8, further comprising the sintering thermal interface material being provided on a center portion without extending to edge portions of the first side of the one of the at least two semiconductor devices that vary in height.

10. The semiconductor package of claim 8, further comprising the solder thermal interface material extending beyond edge portions of the first side of the another of the at least two semiconductor devices that vary in height.

11. The semiconductor package of claim 8, wherein the sintering thermal interface material includes a sintering paste such as a metal sintering paste.

12. The semiconductor package of claim 11, wherein the metal sintering paste includes at least one of a nanoparticle Ag or Cu sintering paste.

13. The semiconductor package of claim 8, wherein the solder thermal interface material includes solder preforms.

14. The semiconductor package of claim 8, wherein the cover member is a heat spreader.

15. A method for forming a semiconductor package, comprising:
providing a substrate having a first side and a second side;
providing a plurality of semiconductor devices,
wherein at least two of the plurality of semiconductor devices vary in height and wherein each of the plurality of semiconductor devices includes a first side and a second side;
connecting the plurality of semiconductor devices to the substrate,
wherein the second side of each of the plurality of semiconductor devices is positioned adjacent to the first side of the substrate;
providing a cover member above the plurality of semiconductor devices;
providing a sintering thermal interface material between the cover member and the first side of one of the at least two semiconductor devices that vary in height; and
providing a solder thermal interface material between the cover member and the first side of another of the at least two semiconductor devices that vary in height.

16. The method of claim 15, further comprising providing the solder thermal interface material extending beyond edge portions of the first side of the another of the at least two semiconductor devices that vary in height.

17. The method of claim 15, further comprising providing the sintering thermal interface material on a center portion without extending to edge portions of the first side of the one of the at least two semiconductor devices.

18. The method of claim 15, further comprising:
measuring an amount of the sintering thermal interface material on the first side of the one of the at least two semiconductor devices that vary in height prior to providing a cover member above the plurality of semiconductor devices; and
providing additional sintering thermal interface material on the first side of the one of the at least two semiconductor devices if the amount fails to exceed a predetermined amount.

19. The method of claim 15, wherein the sintering thermal interface material includes a sintering paste such as a metal sintering paste.

20. The method of claim 15, wherein the cover member is a heat spreader.

\* \* \* \* \*